United States Patent
Hihara et al.

(10) Patent No.: US 7,638,019 B2
(45) Date of Patent: Dec. 29, 2009

(54) METHOD AND DEVICE FOR MANUFACTURING SEMICONDUCTOR OR INSULATOR-METALLIC LAMINAR COMPOSITE CLUSTER

(75) Inventors: Takehiko Hihara, Nagoya (JP); Kenji Sumiyama, Nagoya (JP); Ryoji Katoh, Nagoya (JP)

(73) Assignee: Japan Science and Technology Agency, Saitama (JP)

( * ) Notice: Subject to any disclaimer, the term of this patent is extended or adjusted under 35 U.S.C. 154(b) by 582 days.

(21) Appl. No.: 10/505,813

(22) PCT Filed: Jan. 27, 2003

(86) PCT No.: PCT/JP03/00716

§ 371 (c)(1),
(2), (4) Date: Aug. 26, 2004

(87) PCT Pub. No.: WO03/072848

PCT Pub. Date: Sep. 4, 2003

(65) Prior Publication Data

US 2005/0173240 A1    Aug. 11, 2005

(30) Foreign Application Priority Data

Feb. 26, 2002    (JP)    ............... 2002-049310

(51) Int. Cl.
*C23C 14/00* (2006.01)
*C23C 14/32* (2006.01)
*C25B 11/00* (2006.01)
*C25B 13/00* (2006.01)

(52) U.S. Cl. ............ 204/192.12; 204/298.05; 204/298.06; 204/298.12; 204/192.1; 204/192.15

(58) Field of Classification Search ............ 117/86, 117/97; 118/723 CB; 204/192.11, 298.05; 427/446, 531, 596; 428/221; 505/477; 524/439
See application file for complete search history.

(56) References Cited

U.S. PATENT DOCUMENTS 4,147,573 A * 4/1979 Morimoto .............. 117/97

(Continued)

FOREIGN PATENT DOCUMENTS

EP    0 792 688 A1    3/1997

(Continued)

OTHER PUBLICATIONS

H. Hamakake et al., "Preparation of Fe/Ag Granular Films by Low Energy Cluster Deposition", IEEE Transactions on Magnetics, vol. 35, No. 5, Sep. 1999, pp. 2457-2459.

*Primary Examiner*—Jennifer K Michener
*Assistant Examiner*—Michael Band
(74) *Attorney, Agent, or Firm*—The Webb Law Firm

(57) ABSTRACT

A semiconductor or nonconductor vapor is generated by sputtering targets 11U, 11D in a first sputtering chamber 10, while a metal vapor is generated by sputtering targets 21U, 21D in a second sputtering chamber 20. The semiconductor or nonconductor vapor and the metal vapor are aggregated to clusters during travelling through a cluster-growing tube 32 and injected as a cluster beam to a high-vacuum deposition chamber 30, so as to deposit composite clusters on a substrate 35. The produced composite clusters are useful in various fields due to high performance, e.g. high-sensitivity sensors, high-density magnetic recording media, nano-magnetic media for transportation of medicine, catalysts, permselective membranes, optical-magnet sensors and low-loss soft magnetic materials.

14 Claims, 2 Drawing Sheets

U.S. PATENT DOCUMENTS

| | | | |
|---|---|---|---|
| 4,286,545 A | | 9/1981 | Takagi et al. |
| 4,394,210 A | * | 7/1983 | Morimoto et al. .............. 117/86 |
| 4,559,901 A | * | 12/1985 | Morimoto et al. ..... 118/723 CB |
| 4,882,023 A | * | 11/1989 | Wendman ................... 427/531 |
| 5,064,520 A | * | 11/1991 | Miyake et al. ......... 204/192.11 |
| 5,079,224 A | * | 1/1992 | Higuchi ...................... 505/477 |
| 5,110,435 A | * | 5/1992 | Haberland .................. 427/523 |
| 5,354,445 A | * | 10/1994 | Ito et al. ................ 204/298.05 |
| 5,374,613 A | * | 12/1994 | Noda et al. ................. 505/477 |
| 5,382,457 A | * | 1/1995 | Coombe .................... 427/596 |
| 5,405,906 A | * | 4/1995 | Olsen et al. ................. 524/439 |
| 5,759,634 A | * | 6/1998 | Zang .......................... 427/446 |

FOREIGN PATENT DOCUMENTS

| | | |
|---|---|---|
| JP | 54035178 | 3/1979 |
| JP | 01039370 | 2/1989 |
| JP | 06-172820 | 6/1994 |
| JP | 53-110973 A | 6/1994 |
| JP | 2000-087233 | 3/2000 |
| JP | 2000-309866 | 7/2000 |

* cited by examiner

METHOD AND DEVICE FOR MANUFACTURING SEMICONDUCTOR OR INSULATOR-METALLIC LAMINAR COMPOSITE CLUSTER

BACKGROUND OF THE INVENTION

1. Field of the Invention

The present invention relates to a method of producing composite clusters, wherein a metal is lamellarily compounded with a semiconductor or nonconductor, useful as various functional elements, and also relates to an apparatus for production of such composite clusters.

2. Description of the Related Art

Aggregate of fine particles are useful as functional elements, e.g. gas sensors and permselective membranes, in various industrial fields due to its big specific surface area and good affinity with an atmospheric gas.

Various methods have been proposed so far for producing aggregate of fine particles. For instance, starting material is evaporated and condensed to fine particles in vapor-phase synthesis. According to a colloidal process, fine particles are precipitated from an electrolytic liquid and stabilized with a surfactant. An aerosol process for spraying and pyrolysis of a metal ion-containing liquid, a gas-atomizing process for spraying a mixture of molten metal with an inert gas through a nozzle, and a milling process for mechanically crushing solid material are also proposed for production of such aggregate.

The aerosol process, the milling process and the gas-atomizing process are advantageous for mass-production of clusters but unsuitable for production of clusters, which have particle size conditioned to nanometer order for performance originated in nano-sized particles. The colloidal process can not avoid inclusion of impurities in a product, although clusters of several nanometers in particle size can be mass-produced. The inclusion of impurities degrades quality of the product.

On the other hand, the vapor-phase process promotes growth of clusters in a clean vacuum atmosphere without invasion of impurities. The clusters produced by the vapor-phase process has a chemically active surface effective for improvement of functionality. However, the active surface causes unfavorable oxidation and coalescence of clusters, when fine particles are deposited on a substrate. The oxidation and coalescence impede realization of the functionality originated in nano-sized particles, regardless of very fine clusters.

SUMMARY OF THE INVENTION

The present invention aims at production of metal/semiconductor or metal/nonconductor composite clusters, which exhibit various properties originated in composite structure, under stable conditions, by compounding metal clusters with semiconductor or nonconductor clusters in a high-vacuum atmosphere.

According to the present invention, a semiconductor or nonconductor vapor is generated by sputtering a semiconductor or nonconductor target, while a metal vapor is generated by sputtering a metal target. These sputtering processes are conducted simultaneously but in each system independent from the other. A mixture of the metal vapor with the semiconductor or nonconductor vapor is fed into a cluster-growing tube and then injected as a cluster beam to a substrate preset in a deposition chamber held at a high degree of vacuum. The mixture is deposited as composite clusters on the substrate.

The present invention also proposes an apparatus for production of composite clusters. A semiconductor or nonconductor target is preset in a first sputtering chamber. A metal target is preset in a second sputtering chamber. A movable partition is located between the first and second sputtering chambers. The sputtering chambers communicate through a cluster-growing tube with a deposition chamber held at a high degree of vacuum. The cluster-growing tube is directed to a substrate, which is preset in the deposition chamber.

DETAILED DESCRIPTION OF THE INVENTION

Figure 1:
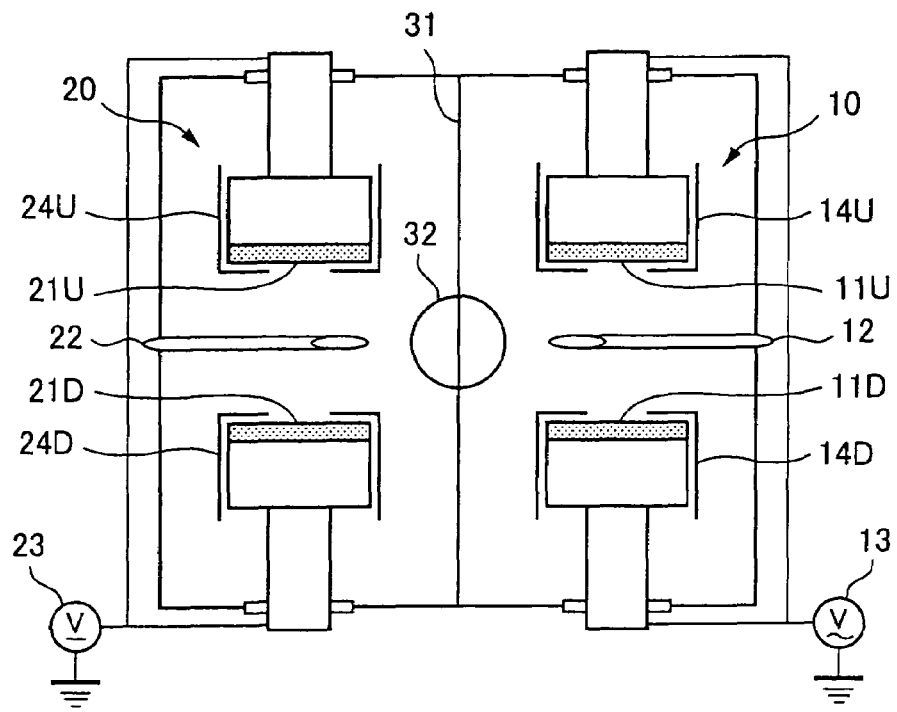
FIG. 1 is a sectional side view illustrating a composite cluster-manufacturing apparatus shown from a side of sputtering chambers.
Figure 2:
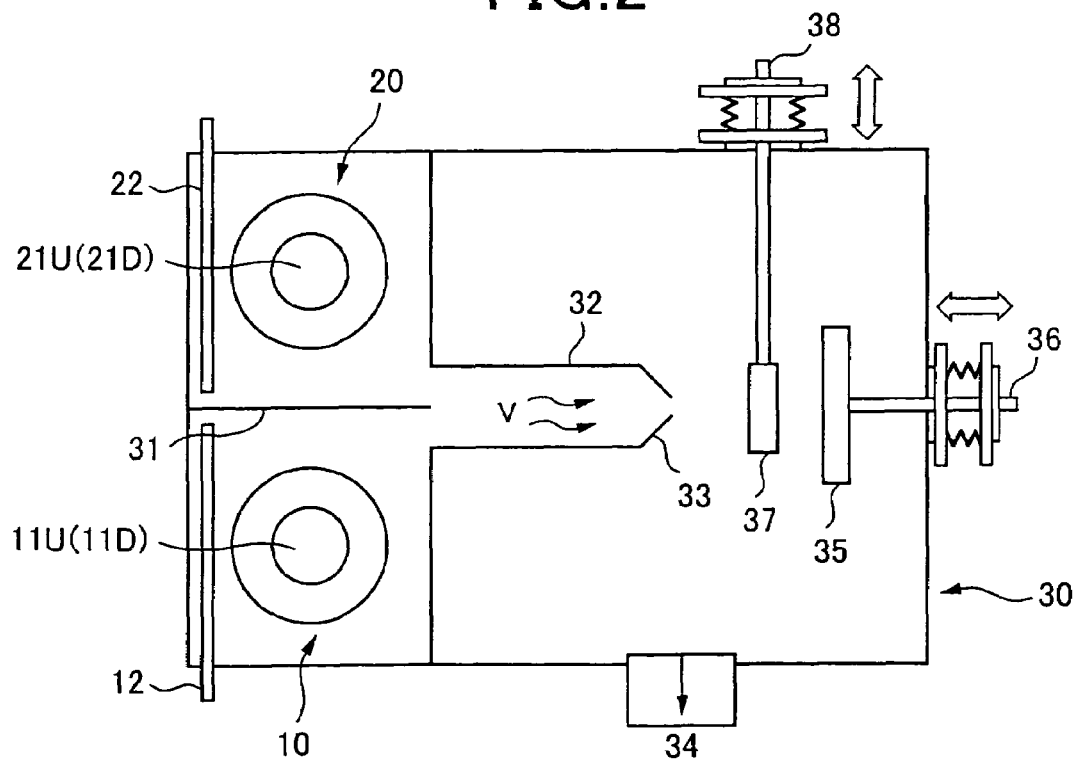
FIG. 2 is a sectional plan view illustrating the same apparatus.

The present invention uses a composite cluster-manufacturing apparatus schematically shown in FIGS. 1 and 2. The apparatus has a first sputtering chamber 10 and a second sputtering chamber 20, each separated from the other by a movable partition 31.

A couple of targets 11U and 11D are located in the first sputtering chamber 10. The targets 11U and 11D face to each other with a gap of 10 cm or so. Inert gas such as Ar is fed through a supply tube 12 to a space between the targets 11U and 11D. The targets 11U, 11D are semiconductive or nonconductive material, in the case where the sputtering chamber 10 is operated for generation of a semiconductor or nonconductor vapor. When a high voltage is applied between the targets 11U and 11D from a high-frequency power source 13, glow discharge occurs between the targets 11U and 11D, and the targets 11U, 11D are sputtered by ionized inert gas atoms, resulting in vaporization of the semiconductive or nonconductive material. The targets 11U and 11D may be partially covered with shields 14U and 14D, so as to limit a glow-discharging area.

The second sputtering chamber 20 also has a couple of targets 21U and 21D and a supply tube 22 for introduction of inert gas to a space between the targets 21U and 21D. The targets 21U, 21D are conductive material, e.g. a transition metal, in the case where the sputtering chamber 20 is operated for generation of a reactive metal vapor. When a high voltage is applied between the targets 21U and 21D from a D.C. power source 23, glow discharge occurs between the targets 21U and 21D, and the targets 21U, 21D are sputtered by ionized inert gas atoms, resulting in vaporization of the conductive material. The targets 21U and 21D may be partially covered with shields 24U and 24D, so as to limit a glow-discharging area.

Generation of the semiconductor or nonconductor vapor is performed under different conditions from generation of the metal vapor. For instance, gaps between the targets 11U and 11D and between the targets 21U and 21D are adjusted to approximately 10 cm, while gaps between the targets 11U, 11D and the shields 14U, 14D and between the targets 21U, 21D and the shields 24U, 24D are adjusted to approximately 0.2 mm so as to inhibit arc-discharge therebetween. Internal pressures of the sputtering chambers 10, 20 are held at a relatively higher value, e.g. 133-1333 Pa by introduction of Ar gas. Glow-discharge necessary for vaporization of the targets 11U, 11D and 21U, 21D is started by application of predetermined voltages between the targets 11U and 11D and between the targets 21U and 21D.

When sputtering conditions, e.g. currents and voltages, for the targets 11U, 11D and 21U, 21D are independently controlled, interference between the targets 11U, 11D and 21U, 21D is avoided. Compositions of the metal vapor and the semiconductor or nonconductor vapor as a cluster source are properly adjusted by control of electric powers applied to the targets 11U, 11D and 21U, 21D.

The semiconductor or nonconductor vapor and the metal vapor are carried as a mixture V by an inert gas stream from the sputtering chambers 10, 20 through a cluster-growing tube 32 and a nozzle 33 to a deposition chamber 30. The deposition chamber 30 is preferably held at a degree of vacuum less than a few Pa, in order to assure a smooth flow of the gaseous mixture through the cluster-growing tube 32. The high-vacuum deposition chamber 30 is also advantageous for suppressing coalescence of clusters, which have flown into the deposition chamber 30.

A flow rate of the gaseous mixture V, which is carried to the cluster-growing tube 32, and a flow ratio of the semiconductor or nonconductor vapor to the metal vapor are controlled by sputtering conditions in the sputtering chambers 10, 20 and positioning of the movable partition 31. Nano-sized lamellar clusters, i.e. composite clusters of the metal with the semiconductor or nonconductor is formed and grown up to nanometer size, during travel of the gaseous mixture V through the cluster-growing tube 32, The composite clusters are passed through the cluster-growing tube 32 and injected together with an Ar gas stream from the nozzle 33 by differential, since the deposition chamber 30 is evacuated by a mechanical booster pump 34. The nozzle 33 is directed to the substrate 35 in the deposition chamber 30, and a distance from the nozzle 33 to the substrate 35 is variable by adjustment of a handling shaft 36. A thickness sensor 37, e.g. a crystal oscillator, is provided between the nozzle 33 and the substrate 35, in order to measure a deposition rate of the clusters on the substrate 35 and an effective thickness of a deposition layer. A position of the thickness sensor 37 in relation with the substrate 35 is controllable by adjustment of a movable shaft 38.

Atoms and molecules vaporized from the targets 11U, 11D and 21U, 21D are fed together with Ar as a carrier gas into the cluster-growing tube 32. The atoms, the molecules and the Ar atoms repeatedly come into ternary collision and form cluster nuclei in the tube 32 while discharging a latent heat. The cluster nuclei are gradually grown up to composite clusters while absorbing gaseous atoms. Since the clusters are formed in a material stream from the sputtering chambers 10, 20 to the deposition chamber 30, growth of the clusters depends on a flow rate of the material stream.

A growth mode of clusters in a plasma-gas condensation process is explained by (1) mutual collision and coalescence of clusters and (2) successive deposition of a metal vapor on embryos as cluster nuclei. Probably, deposition and re-vaporization of metal atoms on and from the cluster nuclei are repeated at an early stage, and clusters come into mutual collision and coalesce together at a latter stage. Since size distribution of the clusters as a whole is determined by these actions, production of mono-disperse clusters is expected by introducing clusters to a high-vacuum atmosphere and depositing them on a substrate before coalescence.

The cluster-growing tube 32 enables mixing the semiconductor or nonconductor clusters with the metal clusters in a high-vacuum atmosphere, so as to produce the composite clusters that the semiconductor or nonconductor clusters are compounded with the metal clusters in various state. For instance, when the semiconductor or nonconductor clusters, which are deposited on the metal clusters as a core, form shelly surface layers, further coalescence of metal clusters on the substrate is inhibited, so that properties originated in nano-size are imparted to the metal clusters.

Figure 3:
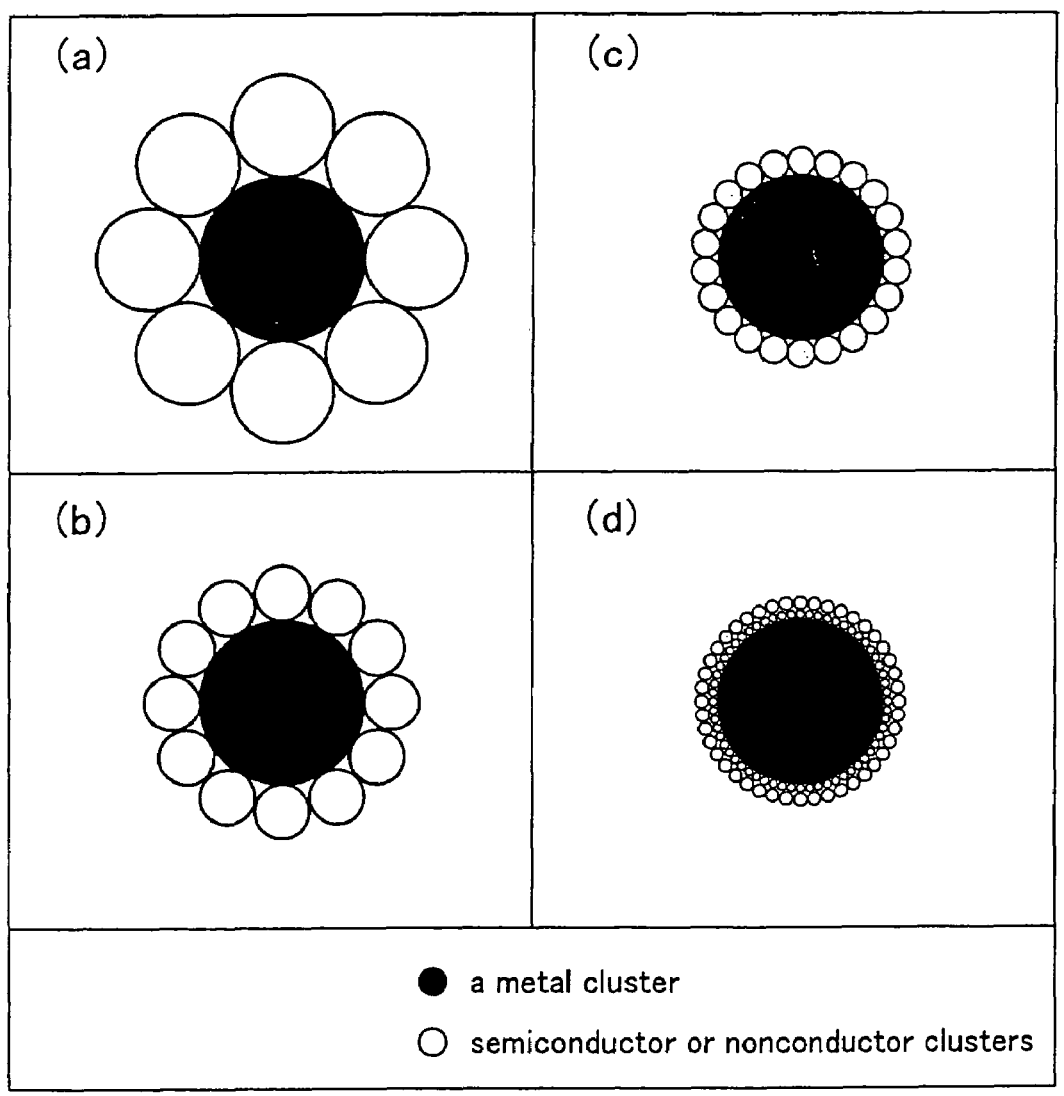
FIG. 3 is a diagram illustrating some examples of composite clusters, which were produced by the inventive process.

Multi-layered composite clusters, which have metal clusters as a core, are bestowed with predetermined properties by controlling number of the semiconductor or nonconductor clusters coalescent to the metal clusters in correspondence to a relative size of the semiconductor or nonconductor clusters with the metal clusters or by depositing the semiconductor or nonconductor clusters as several layers, as shown in FIG. 3. Moreover, coalescence and mixing of the semiconductor or nonconductor clusters with the metal clusters are limited in a zone inside the cluster-growing tube 32 by insertion of the partition 31. The coalescence and mixing can be started at an earlier stage by detachment of the partition 31. Size-control of the semiconductor or nonconductor clusters as well as the metal clusters is performed by changing electric powers applied to the targets 11U, 11D and 21U, 21D, a pressure and a temperature of an inert gas and/or a length of the cluster-growing tube 32. A shape of the multi-layered composite clusters is variously varied in response to the size-control, as shown in FIG. 3.

The other features of the present invention will be apparently understood from the following examples.

A first sputtering chamber 10 was held at an internal pressure of 500 Pa by introduction of Ar as an inert gas at a flow rate of 150 sccm. Si targets 11U, 11D, which were preset in the chamber 10, were sputtered at an electric power of 100 W for generation of Si vapor. Fe targets 21U, 21D, which were preset in a second sputtering chamber 20 held at an internal pressure of 500 Pa by introduction of Ar at a flow rate of 150 sccm, were sputtered at an electric power of 400 W for generation of Fe vapor.

A glass plate as a substrate 35 and a carbon film for TEM observation were preset in a deposition chamber 30. A nozzle 33 of 5 mm in diameter was attached to a top of a cluster-growing tube 32 and located at a position faced to the substrate 35. A distance between the nozzle 33 and the substrate 35 was adjusted to 5 cm. The chamber 30 was held at $1 \times 10^{-4}$ Pa as an initial pressure and 300K.

A gaseous mixture of Si and Fe, i.e. sputtering products, is sucked into the cluster-growing tube 32 by a differential pressure between the sputtering chambers 10, 20 and the deposition chamber 30. When Ar gas passed through the tube 32 at a flow rate of 300 sccm and velocity of 0.5 m/sec., an internal pressure of the deposition chamber 30 reached 1 Pa. Collision and coalescence of Si and Fe atoms were repeated, while the gaseous mixture was travelling through the cluster-growing tube 32. The resultant mixture was injected as a cluster beam through the nozzle 33 to the substrate 35 at a velocity of 300 m/sec. Consequently, Si and Fe clusters were deposited on the substrate 35 at a rate of 1 nm/sec.

A position of the partition 31 was changed under the above conditions, in order to investigate positional effects of the partition 31 on a structure of composite clusters.

Under the condition that a zone for coalescing and mixing the semiconductor clusters with the metal clusters was limited to an inner space of the cluster-growing tube 32 by insertion of the partition 31, Si clusters, which have grown to 5 nm in diameter, were mixed with Fe clusters. As a result, composite clusters had particle size of 10 nm on average with distribution of 8-12 nm and the structure (a) in FIG. 3 that a few Si clusters of 5 nm or less in diameter coalesced to Fe clusters.

A zone for coalescing and mixing the semiconductor clusters with the metal clusters is widely expanded by detachment of the partition 31. When the targets 11U, 11D and 21U, 21D were sputtered with 100 W and 400 W, respectively, without insertion of the partition 31, Si clusters of 1 nm in diameter were mixed with Fe clusters of 10 nm in diameter at an earlier stage. Since Si clusters had a bigger surface energy than Fe clusters due to the differential particle size, Fe clusters were coated with Si clusters. Consequently, the produced composite clusters had the structure (d) in FIG. 3 that many Si clusters were multi-layered on Fe clusters.

In correspondence to change of an effective area of the partition 31 to ⅔ and ⅓, the structures of composite clusters were changed to (b) and (c) in FIG. 3, respectively.

The positional effects of the partition 31 on coalescence of Si clusters, as the above, enables production of composite clusters with various structures. Since properties of the composite clusters is differentiated by the structure, the composite clusters suitable for a certain purpose can be offered by control of the structure. For instance, the composite clusters (a), which have relatively big Si clusters coalesced to Fe clusters, are super paramagnetic as an aggregate of single-domain Fe particles at a normal temperature. The other composite clusters (b)-(d), which have relatively small Si clusters coalesced to Fe clusters, are ferromagnetic at a normal temperature due to dipole-dipole interaction between the particles. Coercivity of the composite clusters (b) was 800 A/dm, and coercivity of the composite clusters (d) was 80 A/dm. That is, coercivity is reduced as a decrease of Si cluster layers in total thickness on Fe clusters, but any of the composite clusters (b)-(d) is useful as functional material with low-loss soft magnetic property.

According to the present invention as mentioned above, a semiconductor or nonconductor vapor and a metal vapor are generated in sputtering chambers, each of which is independently operated from the other, and carried as a gaseous mixture through a cluster-growing tube to a high-vacuum deposition chamber. Composite clusters, which are formed and grown up in the cluster-growing tube, are deposited on a substrate, which is preset in the deposition chamber, without repetition of coalescence and aggregation, so that mono-disperse composite clusters of a semiconductor or nonconductor compounded with a metal can be produced. Since a compounded structure of the clusters is changed by controlling a position of a movable partition between the sputtering chambers and/or flow rates of Ar, the metal vapor and the semiconductor or nonconductor vapor, various properties are imparted to the composite clusters. The produced composite clusters are useful in various fields due to high performance, e.g. high-sensitivity sensors, high-density magnetic recording media, nano-magnetic media for transportation of medicine, catalysts, permselective membranes, optical-magnet sensors and low-loss soft magnetic materials.

The invention claimed is:

1. A method of producing composite clusters of semiconductor (or nonconductor) shells having metal cores via a plasma-gas condensation process, comprising:
   generating glow discharge between a pair of targets formed of at least one kind of semiconductor (or nonconductor) material in a first sputtering chamber;
   ionizing an inert gas introduced to the first sputtering chamber with the glow discharge;
   sputtering the semiconductor (or nonconductor) target with the ionized inert gas to generate semiconductor (or nonconductor) vapor in the first sputtering chamber;
   simultaneously generating glow discharge between a pair of targets formed of at least one kind of metal in a second sputtering chamber, which is located in parallel with the first sputtering chamber and independently operated and separated from the first sputtering chamber by a movable partition located between the first and second sputtering chambers, the partition being extendable up to an inner space of a cluster-growing tube connected centrally between the first and second chambers;
   ionizing an inert gas introduced to the second chamber with the glow discharge;
   sputtering metal targets with the ionized inert gas to generate a metal vapor in the second sputtering chamber;
   carrying both semiconductor (or nonconductor) clusters and metal clusters by inert gas from the first and second sputtering chambers directly into the centrally located cluster-growing tube, wherein the movable partition can be extended up to an inner space of the cluster-growing tube to limit coalescing and mixing of the semiconductor (or nonconductor) clusters and the metal clusters to the inner space of the cluster-growing tube, or partially or fully shortened to allow pre-mixing of the clusters between the chambers; and
   injecting a cluster beam though a nozzle of the cluster-growing tube to a substrate preset in a high-vacuum deposition chamber, so as to deposit composite clusters on the substrate.

2. The method of claim 1, wherein internal pressures of the sputtering chambers are held at a relatively higher value than the deposition chamber by evacuating inert gas from the deposition chamber with a mechanical booster pump in order to assure a smooth flow of the gaseous mixture though the cluster-growing tube.

3. The method of claim 1, wherein the distance between the nozzle and the substrate is varied by adjusting a handling shaft attached to the substrate.

4. The method of claim 1, wherein a thickness sensor controlled by adjusting a movable shaft attached thereto is provided between the nozzle and the substrate in order to measure a deposition rate of the cluster beam on the substrate and an effective thickness of a deposition layer.

5. The method of claim 1, wherein both the first and second sputtering chambers have a gas-inlet therein for introducing an inert gas to a space between the targets.

6. The method of claim 1, wherein the at least one semiconductor (or nonconductor) target and the at least one metal target are partially covered with a shield to limit a glow-discharging area.

7. An apparatus for producing composite clusters of a semiconductor (or nonconductor) shells having a metal cores via a plasma-gas condensation process, comprising:
   a first sputtering chamber equipped with a high-frequency power source and a gas supply tube, wherein a set of targets formed of at least one kind of semiconductor (or nonconductor) material is preset for generation of semiconductor (or nonconductor) vapor;
   a second sputtering chamber equipped with a direct current power source and a gas supply tube, wherein a set of targets formed of at least one kind of metal is preset for generation of a metal vapor, where the first and second sputtering chambers are placed in parallel;
   a cluster-growing tube connected centrally between the first and second chambers;
   a movable partition located between the first and second sputtering chambers, that can be extended up to an inner space of the cluster-growing tube to limit coalescing and mixing of semiconductor (or nonconductor) clusters and metal clusters to the inner space of the cluster-growing tube, or partially or fully shortened to allow pre-mixing of the clusters between the chambers;

a high-vacuum deposition chamber connecting with the cluster-growing tube; and an exit nozzle attached the cluster-growing tube and directed to a substrate preset in the high-vacuum deposition chamber, wherein mixtures of the semiconductor (or nonconductor) clusters and the metal clusters are injected as a cluster beam to the substrate.

8. The apparatus of claim 7, wherein the movable partition is located between the first and second sputtering chambers which, when the movable partition is moved, the change in position of the movable partition affects the formation of the composite clusters, enabling formation of composite clusters with various structures.

9. The apparatus of claim 7, wherein internal pressures of the sputtering chambers are held at a relatively higher value than the deposition chamber by evacuating inert gas from the deposition chamber with a mechanical booster pump in order to assure an effective cooling and a smooth flow of the semiconductor (or nonconductor) and metal vapor through the cluster-growing tube.

10. The apparatus of claim 7, wherein the distance between the nozzle and the substrate is varied by adjusting a handling shaft attached to the substrate.

11. The apparatus of claim 7, wherein a thickness sensor controlled by adjusting a movable shaft attached thereto is provided between the nozzle and the substrate in order to measure a deposition rate of the cluster beam on the substrate and an effective thickness of a deposition layer.

12. The apparatus of claim 7, wherein the first sputtering chamber contains two semiconductor (or nonconductor) targets facing each other with a gap between them and the second sputtering chamber contains two metal targets facing each other with a gap between them, each semiconductor (or nonconductor) target and metal target partially covered with a shield to limit a glow-discharge area.

13. The apparatus of claim 12, wherein both the first sputtering chamber and the second sputtering chamber have gas-inlets therein for introducing an inert gas to a space between the targets.

14. An apparatus for producing composite clusters of semiconductor (or nonconductor) shells having metal cores via a plasma-gas condensation process, comprising:

a first sputtering chamber equipped with a high-frequency power source for generation of glow discharge and a gas-inlet for introduction of an inert gas, wherein a set of targets formed of at least one kind of semiconductor (or nonconductor) material is preset for generation of semiconductor (or nonconductor) vapor;

a second sputtering chamber equipped with a direct current power source for generation of glow discharge and a gas-inlet for introduction of an inert gas, wherein the second sputtering chamber is located in parallel with the first sputtering chamber and a set of targets formed of at least one kind of metal is preset for generation of a metal vapor;

a centrally located cluster-growing tube through which the first and second sputtering chambers are directly connected;

a shield that partially covers each target to limit a glow-discharge area;

a movable partition that is located between the first and second sputtering chambers and can be extended up to an inner space of the cluster-growing tube to limit coalescing and mixing or semiconductor (or nonconductor) clusters and metal clusters to the inner space of the cluster-growing tube, or partially or fully shortened to allow pre-mixing of the clusters between the chambers;

a high-vacuum deposition chamber connecting with the cluster-growing tube, wherein internal pressures of the sputtering chambers are held at a relatively higher value than the deposition chamber by evacuating inert-gas from the deposition chamber with a mechanical booster pump in order to assure an effective cooling and a smooth flow of the semiconductor (or nonconductor) and metal vapor through the cluster-growing tube;

a nozzle attached to a top of the cluster-growing tube and directed to a substrate preset in the high-vacuum deposition chamber, wherein composite clusters formed of the semiconductor (or nonconductor) vapor and the metal vapor are injected as a cluster beam to the substrate, and further wherein a distance between the nozzle and the substrate is varied by adjusting a handling shaft attached to the substrate; and a thickness sensor controlled by adjusting a movable shaft attached thereto between the nozzle and the substrate in order to measure a deposition rate of the cluster beam on the substrate and an effective thickness of a deposition layer.

* * * * *

UNITED STATES PATENT AND TRADEMARK OFFICE
CERTIFICATE OF CORRECTION

PATENT NO. : 7,638,019 B2
APPLICATION NO. : 10/505813
DATED : December 29, 2009
INVENTOR(S) : Hihara et al.

It is certified that error appears in the above-identified patent and that said Letters Patent is hereby corrected as shown below:

Column 6, Line 50 of Claim 7, "having a metal cores" should read -- having metal cores --

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,638,019 B2  Page 1 of 1
APPLICATION NO. : 10/505813
DATED : December 29, 2009
INVENTOR(S) : Hihara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 877 days.

Signed and Sealed this

Ninth Day of November, 2010

David J. Kappos
*Director of the United States Patent and Trademark Office*